(12) United States Patent
Lee et al.

(10) Patent No.: US 9,116,438 B2
(45) Date of Patent: Aug. 25, 2015

(54) METHOD OF CORRECTING FLARE AND METHOD OF PREPARING EXTREME ULTRA VIOLET MASK

(75) Inventors: Young-Mi Lee, Seoul (KR); In-Sung Kim, Suwon-Si (KR); Ji-Soong Park, Yongin-Si (KR); Byoung-Sup Ahn, Seongnam-Si (KR); Jae-Pil Shin, Suwon-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 653 days.

(21) Appl. No.: 13/410,518

(22) Filed: Mar. 2, 2012

(65) Prior Publication Data
US 2012/0224156 A1 Sep. 6, 2012

(30) Foreign Application Priority Data
Mar. 3, 2011 (KR) .......................... 10-2011-0019097

(51) Int. Cl.
| G03B 27/68 | (2006.01) |
| G03B 27/52 | (2006.01) |
| G03B 27/32 | (2006.01) |
| G03F 1/36  | (2012.01) |
| G03F 7/20  | (2006.01) |
| G03F 1/22  | (2012.01) |
(Continued)

(52) U.S. Cl.
CPC .. G03F 1/36 (2013.01); G03F 1/22 (2013.01); G03F 1/84 (2013.01); G03F 7/70433 (2013.01); G03F 7/70441 (2013.01); G03F 7/70591 (2013.01); G03F 7/70941 (2013.01)

(58) Field of Classification Search
CPC ............... G03F 1/22; G03F 1/24; G03F 1/36; G03F 1/84; G03F 7/70433; G03F 7/70441; G03F 7/70591; G03F 7/70941
USPC ...... 355/52, 53, 55, 67–71, 75, 77; 250/492.1, 492.2, 492.22, 493.1, 548; 430/5, 8, 22, 30, 311, 312
See application file for complete search history.

(56) References Cited

U.S. PATENT DOCUMENTS 7,186,481 B2 * 3/2007 Yamamoto et al. ............... 430/5
7,604,912 B2 10/2009 Yao et al.
(Continued)

FOREIGN PATENT DOCUMENTS

| JP | 2005-085791 | 3/2005 |
| KR | 10-0737086  | 7/2007 |
(Continued)

OTHER PUBLICATIONS

English Abstract Publication No. 10-2009-0037188 (for 10-0904600), Apr. 15, 2009.
(Continued)

*Primary Examiner* — Christina Riddle
(74) *Attorney, Agent, or Firm* — F. Chau & Associates, LLC

(57) ABSTRACT

A method of correcting flare includes measuring flare of a test pattern, calculating point spread functions (PSFs) of the flare as a function of distance, and correcting the flare using corresponding PSFs for an influence range of the flare. The influence range is divided into a first range less than a predetermined distance and a second range equal to or greater than the predetermined distance, and corresponding PSFs are separately applied to the first and second ranges to correct the flare.

16 Claims, 8 Drawing Sheets

(51) Int. Cl.
*G03F 1/84* (2012.01)
*G03B 27/42* (2006.01)
*G03B 27/54* (2006.01)

(56) References Cited

U.S. PATENT DOCUMENTS

| | | | |
|---|---|---|---|
| 2003/0149956 A1* | 8/2003 | Singh et al. | 716/21 |
| 2004/0209170 A1* | 10/2004 | Broeke et al. | 430/5 |
| 2005/0225736 A1* | 10/2005 | Yao et al. | 355/52 |
| 2005/0257187 A1* | 11/2005 | Gallatin et al. | 716/21 |
| 2007/0260437 A1* | 11/2007 | Coskun et al. | 703/6 |
| 2009/0292508 A1* | 11/2009 | Melvin et al. | 703/1 |
| 2010/0058263 A1* | 3/2010 | Tyminski et al. | 716/5 |
| 2011/0065027 A1* | 3/2011 | Inanami et al. | 430/5 |

FOREIGN PATENT DOCUMENTS

| | | |
|---|---|---|
| KR | 10-0904600 | 6/2009 |
| KR | 10-2009-0099404 | 9/2009 |

OTHER PUBLICATIONS

English Abstract Publication No. 10-2009-0099404, Sep. 22, 2009.
English Abstract Publication No. 10-2006-0014358 ( for 10-0737086), Feb. 15, 2006.
English Abstract Publication No. 2005-085791, Mar. 31, 2005.

* cited by examiner

METHOD OF CORRECTING FLARE AND METHOD OF PREPARING EXTREME ULTRA VIOLET MASK

CROSS-REFERENCE TO RELATED APPLICATIONS

This application claims priority under 35 U.S.C. §119 from Korean Patent Application No. 10-2011-0019097, filed on Mar. 3, 2011, in the Korean Intellectual Property Office, the contents of which are herein incorporated by reference in their entirety.

BACKGROUND

Embodiments of the inventive concept are directed to a method of manufacturing a semiconductor device, and more particularly, to a method of correcting flare and a method of preparing a mask, in a lithography process.

A lithography process in a method of manufacturing a semiconductor device is a process for forming a circuit pattern by irradiating light on a photosensitive film coated on a substrate. A laser beam may be used as a light source in the lithography process, but this optically restricts the lithography process due to a reduced line width. Accordingly, new light sources, such as an extreme ultraviolet (EUV) source, an electron beam source, an X-ray source, or an ion beam source, have become more widely used, with the EUV source and the electron beam source being developed as next-generation exposure technology methods. EUV lithography technology uses an EUV wavelength of up to 13.4 nm, but since most materials have high light absorption in the EUV domain, an EUV exposure device optical system uses a reflector to use EUV light.

SUMMARY

Embodiments of the inventive concept provide a method of correcting a critical dimension (CD) error due to flare during an extreme ultraviolet (EUV) lithography process, and a method of preparing an EUV mask capable of correcting such a flare effect.

According to an aspect of the inventive concept, there is provided a method of correcting flare in an extreme ultraviolet (EUV) lithography process, the method including: measuring flare of a test pattern; calculating point spread functions (PSFs) of the flare as a function of distance; and correcting the flare using the corresponding PSF for an influence range of the flare.

The influence range may be divided into a first range less than a predetermined distance and a second range equal to or greater than the predetermined distance. When correcting the flare uses different operations for each of the first and second influence ranges, a PSF of the flare in the first range may be used for a chip level OPC correction, and a PSF of the flare in the second range may be used for long-range flare correction or writing.

The predetermined distance may correspond to a distance between full-fields on which an exposure is performed, or a width of a scribe lane of a wafer. The first range may include a short-range and a middle-range, which are less than the width of the scribe lane, and the second range may include a long-range equal to or greater than the width of the scribe lane.

The PSFs may be convolved with a density map of the test pattern to yield a flare map, and may be used for at least one of OPC, long-range flare correction, and writing. When the PSFs are used for writing, the flare map may be converted into a dose map.

According to another aspect of the inventive concept, there is provided a method of preparing an extreme ultraviolet (EUV) mask, the method including: measuring a critical dimension (CD) and flare of a test pattern on a wafer formed using a test mask; calculating point spread functions (PSFs) of the flare; calibrating a model based on the CD, and preparing an algorithm for optical proximity correction (OPC); performing and verifying OPC on a mask using the calibrated model and the algorithm; performing mask tape-out (MTO) by transmitting OPC result data for mask preparation; performing mask process correction (MPC) by correcting a mask process proximity effect based on the OPC result data; dividing MPC result data into regions for the mask preparation; and adjusting a mask preparation exposure dose based on the divided result data for each region, wherein PSFs corresponding to an influence range are used to correct the flare.

The influence range may be divided into a first range less than a predetermined distance and a second range equal to or greater than the predetermined distance. PSFs corresponding to different influence ranges may be separately used in a same correction operation or in different correction operations. When correcting the flare uses different operations for each of the first and second influence ranges, PSFs of the flare in the first range may be used for a chip level correction that includes calibrating the model, performing OPC, and verifying OPC, and a PSF of the flare in the second range may be used for any one of correcting long-range flare and adjusting the dose after performing MPC.

According to another aspect of the inventive concept, there is provided a method of correcting flare in extreme ultraviolet (EUV) lithography. The method includes providing point spread functions (PSFs) of flare of a test pattern as a function of distance, and correcting the flare using the corresponding PSF for an influence range of the flare. The influence range is divided into a first range less than a predetermined distance and a second range equal to or greater than the predetermined distance, and corresponding PSFs are separately applied to the first and second ranges to correct flare.

Correcting flare may comprise performing optical proximity correction (OPC) over the first and second influence ranges. Alternatively, correcting flare may comprise performing a chip level OPC correction in the first range, and long-range flare correction or writing in the second range.

The PSFs may be convolved with a density map of the test pattern to yield a flare map, and the flare map may be converted into a dose map when the PSFs are used for writing.

DETAILED DESCRIPTION OF EXEMPLARY EMBODIMENTS

Figure 1A:
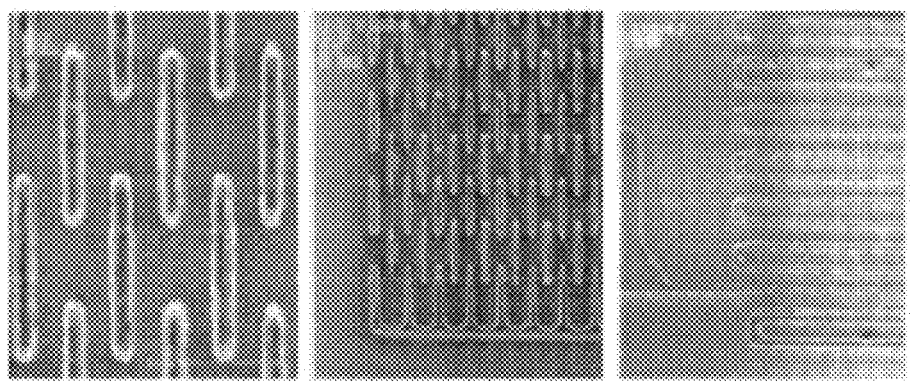
FIGS. 1A and 1B are photographic images of patterns on wafers showing an effect of flare on wafer patterning.

The attached drawings for illustrating exemplary embodiments of the inventive concept are referred to provide an understanding of exemplary embodiments, the merits thereof, and the objectives accomplished by the implementation of exemplary embodiments. It will be understood that when an element is referred to as being "on" another element, it can be directly on the other element, or intervening elements may also be present. Also, in drawings, thicknesses or sizes of elements may be exaggerated for convenience of description and clarity, and elements not related to the description may be omitted. Like reference numerals in the drawings denote like elements.

Figure 1B:
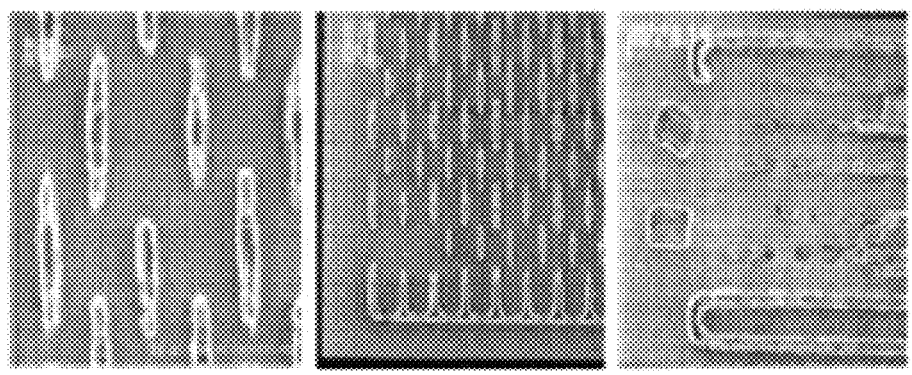

FIGS. 1A and 1B are photographic images of patterns on wafers showing effects of flare on wafer patterning, in which FIG. 1A is a scanning electron microscope (SEM) photographic image with less than 5% flare, and FIG. 1B is an SEM photographic image with 10% or greater flare.

Referring to FIGS. 1A and 1B, distortion of patterns in FIG. 1B is higher than that in FIG. 1A for the same pattern. In other words, the distortion of patterns increases as the amount of flare increases. Accordingly, the amount of flare should be reduced. However, manufacturing a perfect reflector is challenging, as is reducing the amount of flare to be less than or equal to a predetermined amount since the amount of flare varies according to a size and density of pattern.

In addition, reducing an absolute amount of flare is useful, but alternatively, limitations of an extreme ultraviolet (EUV) system may be overcome by preparing a mask that can minimize distortion of a pattern due to flare. In this case, the amount of flare is quantified according to the size and density of the pattern.

Flare may be classified as short-range flare, middle-range flare, and long-range flare according to a range of influence. Short-range flare affects distances within several μm, middle-range flare affects distances in the range from several μm to dozens of μm, and long-range flare affects distances in the range equal to or greater than dozens of μm. Long-range flare may affect distances equal to or greater than 10 mm. However, such classification of flare is arbitrary and non-limiting. Accordingly, flare may be classified based on other criteria. For example, flare may be classified according to causes or other distance ranges.

Flare may be measured using Kirk's method, also referred to as a pad disappearing method. According to Kirk's method, flare is calculated by obtaining an exposure when a predetermined mask pattern on a wafer, which normally blocks light, is over-exposed to the extent that the predetermined mask pattern disappears. In Kirk's method, a flare amount may be calculated using $(E_0/E) \times 100(\%)$, wherein $E_0$ denotes a threshold energy for a photoresist and E denotes an exposure energy required for a pad having any size to disappear.

Figure 2A:
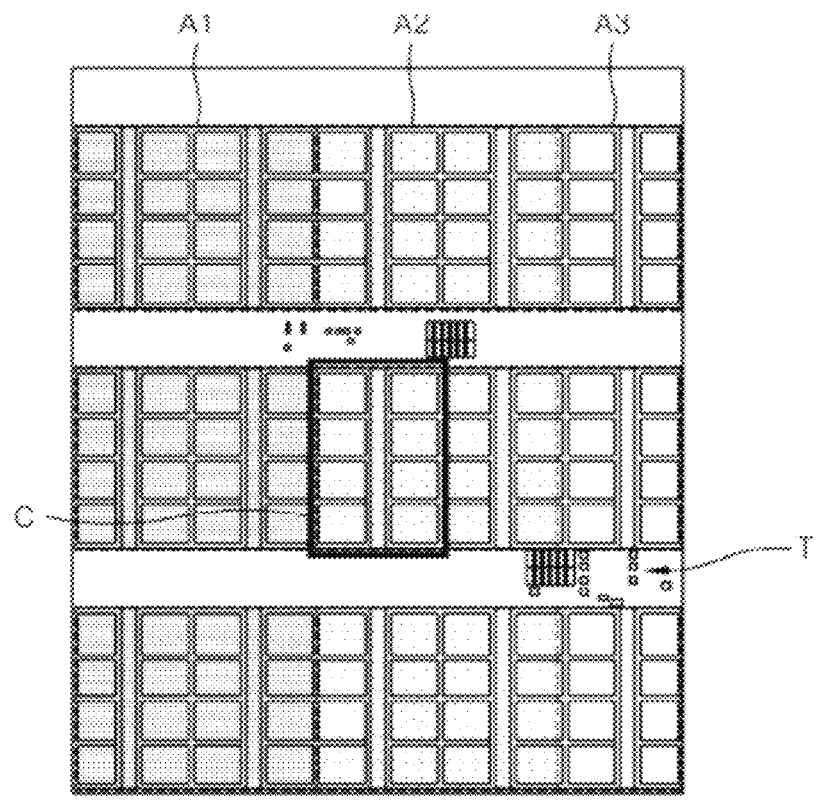
FIG. 2A is a plan view of a full field pattern structure that illustrates an embodiment of the inventive concept.

FIG. 2A is a plan view of a full field pattern structure that illustrates an embodiment of the inventive concept. Here, full-field refers to a pattern region transferred via one exposure, and may also be referred to as an exposing field or a shot region.

Referring to FIG. 2A, the full-field includes a plurality of chips, for example, 3 chips in a lengthwise direction and 5 chips in a widthwise direction. A rectangle C indicated by a thick solid line in the center corresponds to one chip. In FIG. 2A, T denotes a test pattern or a dummy pattern formed in a scribe lane around a chip. The test pattern T is a subsidiary pattern that can resolve optical proximity correction (OPC) deviations due to density differences between main patterns in the chip, and is not formed on a wafer.

As shown in FIG. 2A, chips in the full-field may be classified into three regions with respect to flare. In other words, the full-field may be divided into a region A1 including 6 chips on the left, a region A2 including 6 chips in the center, and a region A3 including 3 chips on the right. The full-field divisions result from the application of flare generated during the exposure of an adjacent full-field to the next full-field. In a current embodiment, the exposing is performed from left to right.

Accordingly, full-field flare includes short-range flare, middle-range flare, and long-range flare due to the main pattern and the test pattern T in the full-field, along with long-range flare of the adjacent full-field.

As such, since flare affects regions differently, OPC may be performed on the entire full-field, which reflects different amounts of flare according to the regions. However, it is challenging to perform OPC on the entire full-field because of the amount of data required from the mask design for preparing the mask, and performing OPC is also expensive and time consuming.

For reference, OPC is a method of suppressing an optical proximity effect (OPE) by correcting a pattern layout on a mask for transferring a pattern. The OPE is generated during an exposure due to diffraction and scattering from neighboring patterns as patterns are miniaturized. A flare effect is insignificant when a conventional light source, such as a krypton fluoride laser (KrF) or an argon fluoride laser (ArF), is used. Thus OPC may be performed on a single chip, and the performance of OPC on a single chip may be repeated on all chips in the full-field.

Figure 2B:
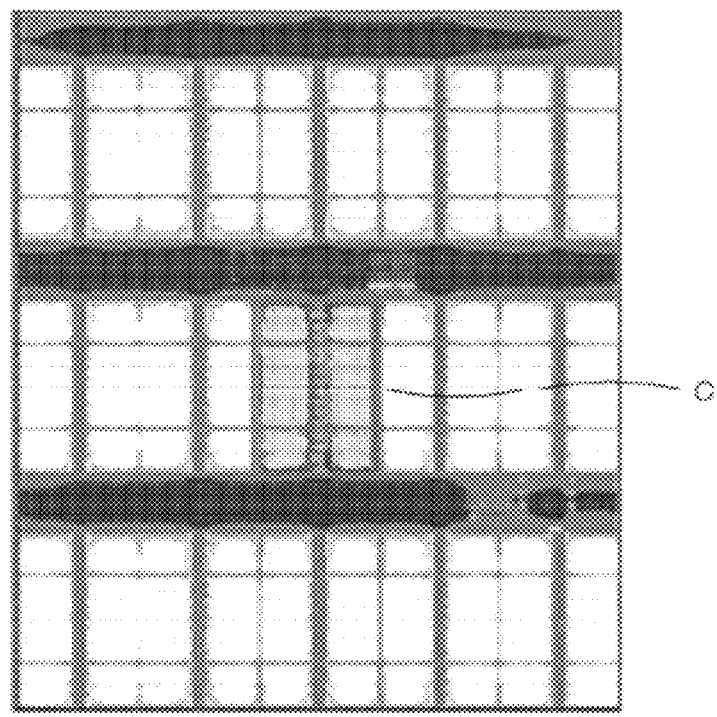
FIGS. 2B and 2C are photographic images respectively showing a flare map in the full-field of FIG. 2A, and a flare map in a unit chip.
Figure 2C:
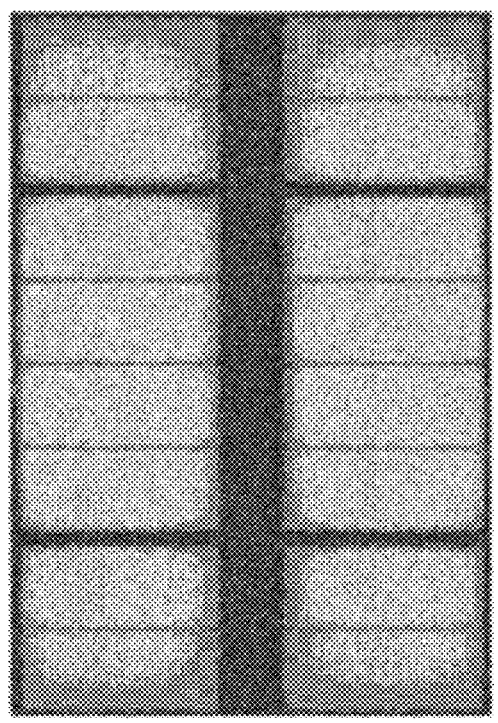

FIGS. 2B and 2C are photographic images respectively showing a flare map in the full-field of FIG. 2A, and a flare map in a unit chip. FIG. 2C is a magnified photographic image of a flare map in a darker chip C in the center of FIG. 2B.

Referring to FIGS. 2B and 2C, the flare maps of each of the chips in the entire flare map of FIG. 2B differ from each other. The differences in the flare maps are mainly due to the long-range flare of the adjacent full-field, because short- and middle-range flare is expected to be essentially identical over a relatively short distance if the main patterns of the chips are identical. In other words, short- and middle-range flare is affected by density of the main patterns of the chips, except for in exceptional cases.

Accordingly, if long-range flare is removed from the chips, the flare maps of the chips may be essentially identical. If the flare maps are identical, OPC may be repeatedly performed at a chip level for all chips in a full-field, similar to performing OPC using a conventional ArF source. Of course, performing OPC at the chip level corrects short and middle-range flare effects.

Furthermore, since an arc-shaped slit is used in EUV lithography, light may be obliquely incident on a mask, and such obliquely incident light may generate a shadow effect due to an absorber layer of the mask. Chip level OPC according to a current embodiment may correct a mask layout by correcting the flare and shadow effects.

In addition, since long-range flare values vary slowly as compared to short-range flare, long-range flare may be corrected by dividing a section into large subsections and by performing separate long-range flare correction processes after a mask tape-out (MTO) process, for example, after a mask process correction (MPC) process, or by correcting long-range flare in a writing process.

For example, in a current embodiment, short- and middle range flare may be corrected via chip level OPC, and long-range flare may be corrected after an MTO at a mask level. Here, an operation after the MTO process may refer to all operations after the MTO process, and correcting long-range flare after the MTO may mean that long-range flare is corrected during a separate long-range flare correcting process or a writing process. The operations performed after the MTO process will be described in detail below with reference to FIG. 8.

Figure 3:
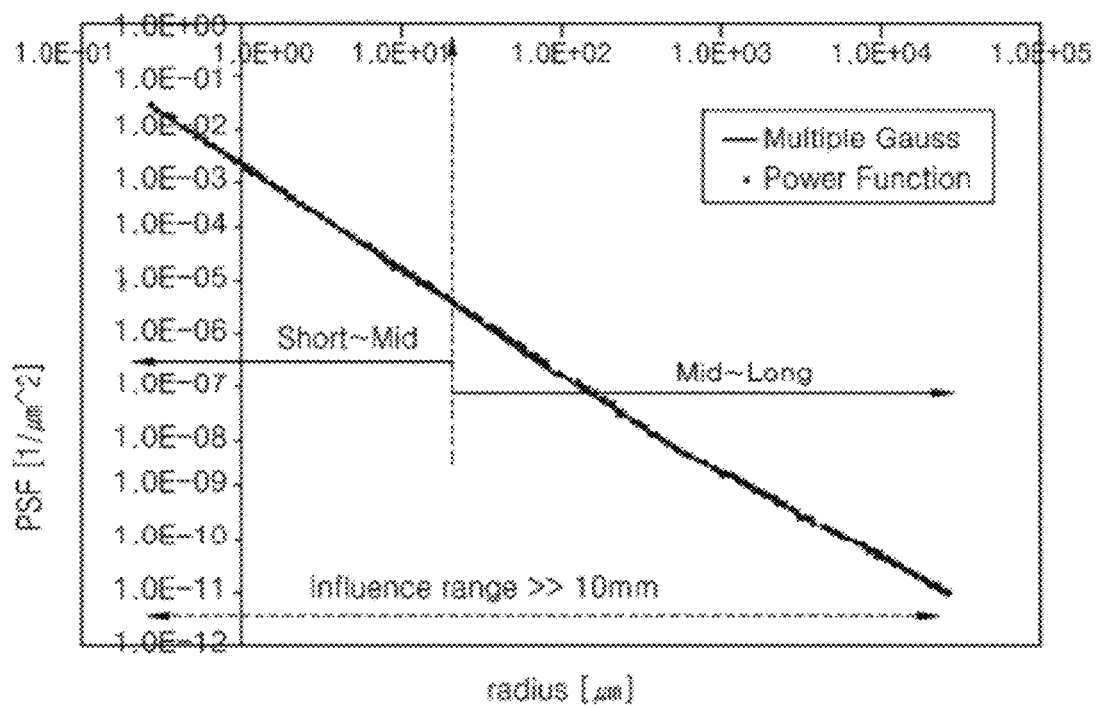
FIG. 3 is a graph of a point spread function (PSF) as a function of a flare radius.

FIG. 3 is a graph of a point spread function (PSF) as a function of a flare radius.

Flare may be represented as a PSF derived from the surface roughness of a mirror used in an exposure apparatus. The PSF may be approximated as $1/r^{N+1}$, i.e., a inverse power function. Here, r denotes a distance from a light source and N is a real number. Accordingly, the PSF is inversely proportional to the distance r to the power of N+1, and may affect long distances, up to several to dozens of mm, depending on surface processing technology.

Using a predetermined geometric structure, flare may be converted into the PSF. In other words, flare may be measured using Kirk's method to represent flare as a function of distance, thereby converting the flare to the PSF.

When a PSF is calculated, the PSF is convolved with a density map of a target pattern, and is used to correct a mask layout during OPC, long-range flare correction, or a writing process. Flare may be corrected by deconvolving the PSF.

Referring to FIG. 3, the graph shows PSF values as a function of the radius in units of μms, in which the PSF values vary as $1/r^{N+1}$. The PSF may further include a proportional constant. In other words, PSF may be described as $K/r^{N+1}$. The PSF in the graph of FIG. 3 is expressed as an inverse power function depicted as a dotted line, and a Gaussian function in the graph of FIG. 3 is shown as a solid line, and results of the inverse power and Gaussian functions are almost identical.

Short and middle-range flare may be distinguished from long-range flare based on radius, with short and middle-range flare corresponding to a distance of about 50 to about 70 μm between full-fields or a scribe lane width. Accordingly, short- and middle-range flare may be corrected by chip level OPC, and long-range flare may be corrected after an MTO process.

Figure 4:
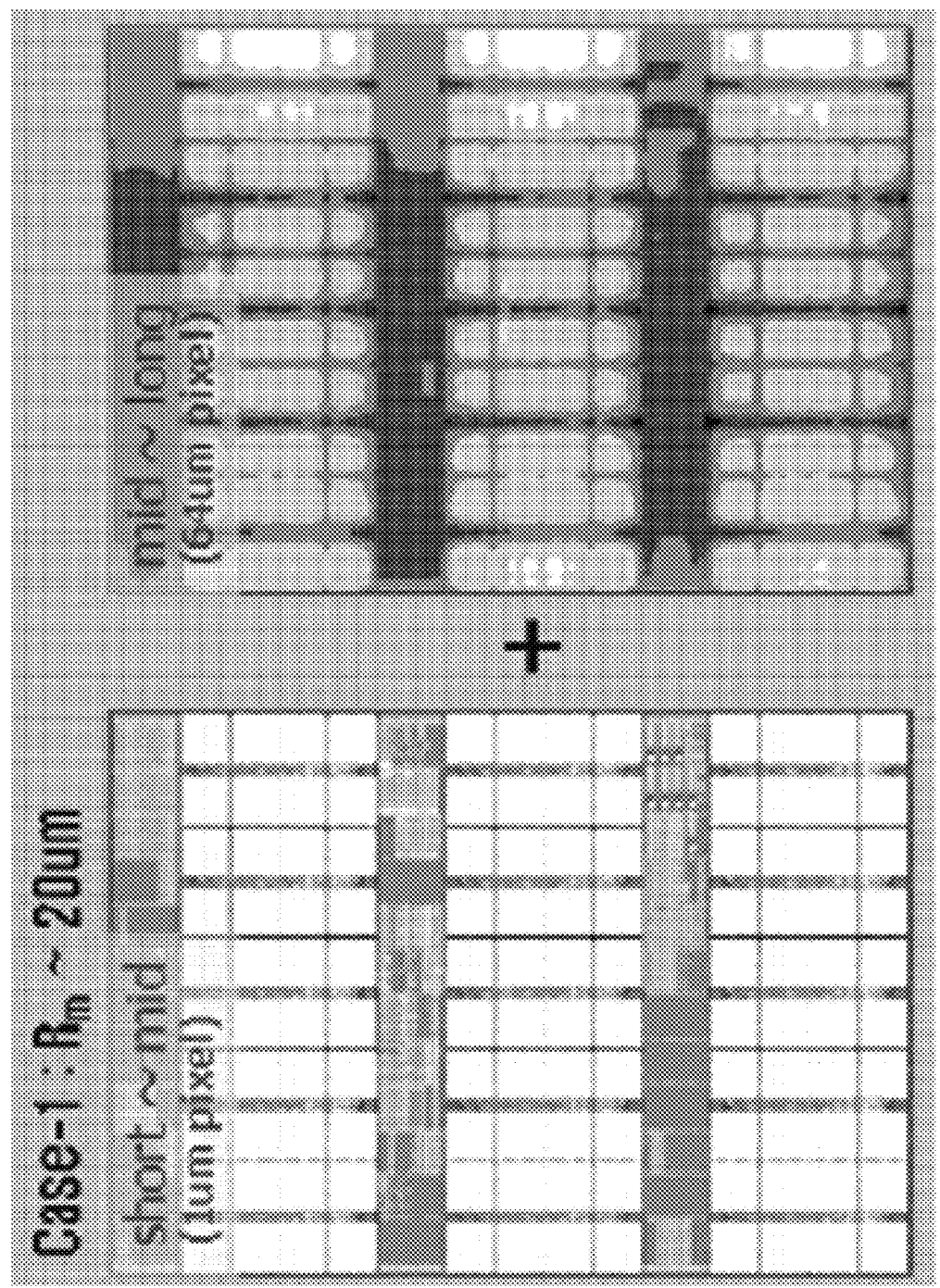
FIGS. 4 and 5 are photographic images of flare maps in short and middle-ranges, and in middle and long-ranges, respectively based on radii of 20 μm and 70 μm.
Figure 5:
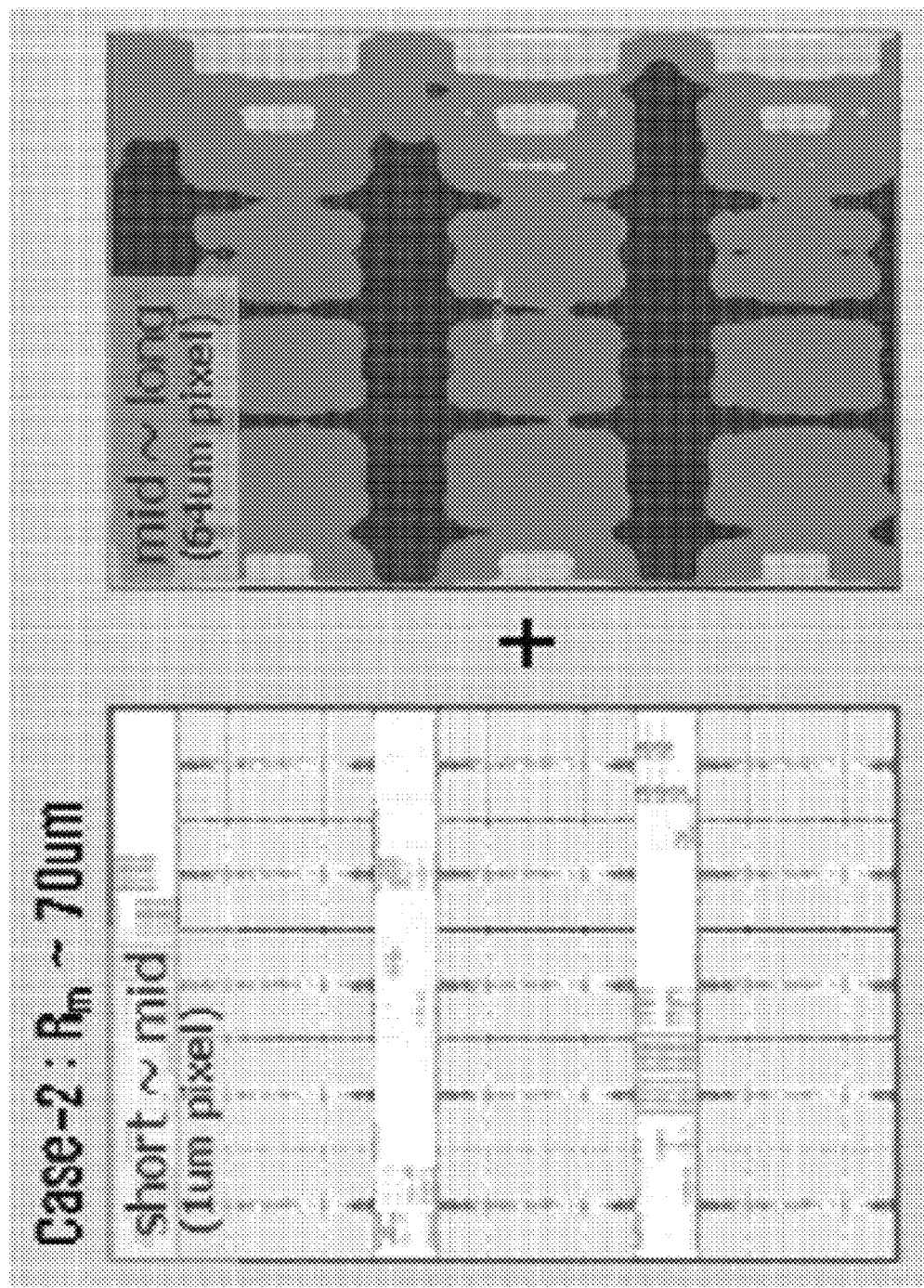

FIGS. 4 and 5 are photographic images of flare maps in short and middle-ranges, and in middle and long-ranges respectively based on radii of 20 μm and 70 μm.

Referring to FIG. 4, the flare map on the left has PSF values typical of short- and middle-range flare, and the flare map on the right has PSF values typical of middle- and long-range flare, for distances of about 20 μm. Also, referring to FIG. 5, the flare map on the left has PSF values typical of short- and middle-range flare, and the flare map on the right has PSF values typical of middle and long-range flare, for distances of about 70 μm.

As described above, the definitions of short, middle, and long-ranges may vary. Accordingly, hereinafter, middle and long-range flare will be referred to as long-range flare to clarify terminology. For example, the "1 μm pixel" written inn the upper left of the left flare maps of FIGS. 4 and 5, and the "64 μm pixel" written in the upper left of the right flare maps of FIGS. 4 and 5 mean that the PSFs are respectively calculated in units of 1 μm and 64 μm. For reference, the full-field is 26 mm wide and 33 mm long.

As shown in FIGS. 4 and 5, differences between short- and middle-range flare maps are large, but differences between long range flare maps are not large and have broad values. In other words, a section may be classified for correction by classifying regions in the long range flare map into black, light gray, dark gray, and white. Thus, long-range flare may be corrected with little calculation.

In addition, for short- and middle-range flare maps, if the flare maps of a plurality of chips are somewhat identical, the long-range flare maps have a broad value over a relatively long distance, and thus long-range flare may be accurately corrected when flare is classified based on distance. As shown in FIGS. 4 and 5, in the short and middle-range flare, the chips have similar flare maps when the flare is classified based on 70 μm.

Accordingly, short- and middle range flare may be distinguished from the long-range flare for distances in a range from about 50 to about 70 μm corresponding to the width of the scribe lane or the distance between the full-fields on which exposing is repeatedly performed. Thus, in a current embodiment, the short and middle-range flare and the long-range flare may be distinguished over a range from about 50 to about 70 μm, and then respectively corrected using OPC and a process after an MTO.

Figure 6:
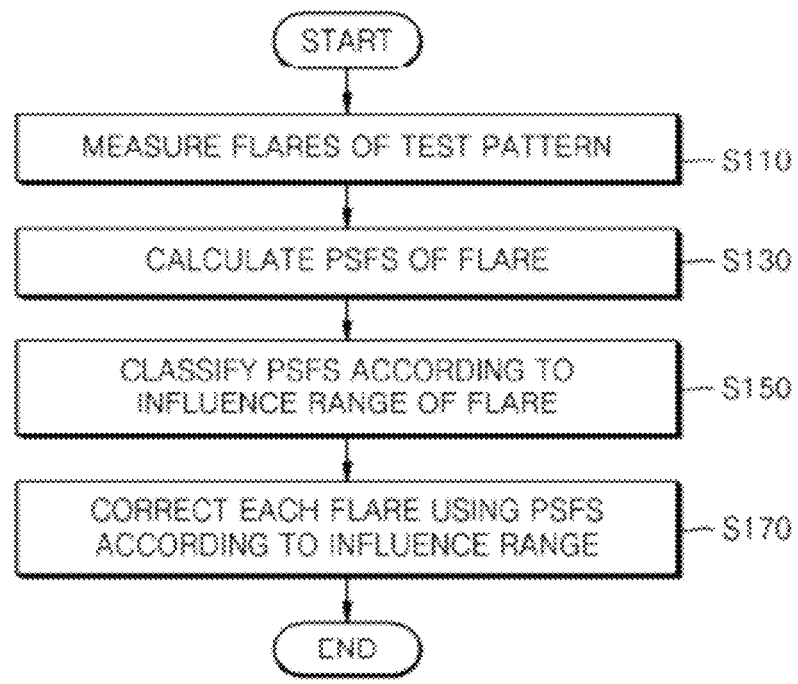
FIG. 6 is a flowchart illustrating a method of correcting flare, according to an embodiment of the inventive concept.

FIG. 6 is a flowchart illustrating a method of correcting flare, according to an embodiment of the inventive concept.

Referring to FIG. 6, flare of a test pattern is first measured in operation S110. Flare may be measured using Kirk's method described above, but methods of measuring flare are not limited to Kirk's method. In other words, any method of accurately measuring flare may be used in operation S110.

Then, PSFs of the measured flare are calculated in operation S130. The PSFs may be determined by modeling the measured flare as a function of distance. For example, the PSF may be expressed in a graph of PSF values as a function of radius by being modeled by an inverse power law such as $1/r^{N+1}$ or $K/r^{N+1}$.

Then, the PSFs may be classified according to a predetermined standard based on an influence range of the flare, in operation S150. For example, the PSFs may be classified into short and middle-range flare and long-range flare based on a range of about 50 to about 70 μm that correspond to a width of a scribe lane or a distance between full-fields on which the exposure is repeatedly performed. Since operation S150 is a conceptual operation, operation S150 is not necessarily performed after operation S130, but may be performed before operation S130 or included in operation S110 or S130. Also, operation 5150 may be predetermined before correcting the flare.

Then, the flare is corrected using the PSFs according to the influence range, in operation S170. In detail, in case (1) short- and middle-range flare may be corrected by performing chip level OPC by deconvolving the PSF of the short and middle-range flare, and the long-range flare may be corrected by a post-MTO process, i.e., during a long-range flare correcting process or a writing process, by deconvolving the PSF of the long-range flare. Alternatively, in case (2) the short- and middle-range flare may be corrected by performing chip level OPC by deconvolving the PSF of the short- and middle range flare, and the long-range flare may be corrected by performing mask level OPC on the long-range flare.

In case (1) above, when the flare correction is divided into an OPC and a post-MTO process, it is possible to separately verify results of the OPC and the post-MOT process, and thus increasing flare correction accuracy and reducing the time involved.

In case (2) above, although it may challenging to classify the flare into two ranges for correction purposes, doing so simplifies the correction calculation with respect to performing OPC on the entire flare at once. For example, OPC may be performed on all full field chips by repeatedly performing OPC on one chip for the short and middle-range flare, and then performing OPC for long-range flare with a large step correction since the PSF of a long-range flare is broad.

Hereinabove, only details related to correcting the flare have been described, but operations other than correcting the flare may be performed while preparing a mask. A method of preparing a mask that includes flare correction will now be described.

Figure 7:
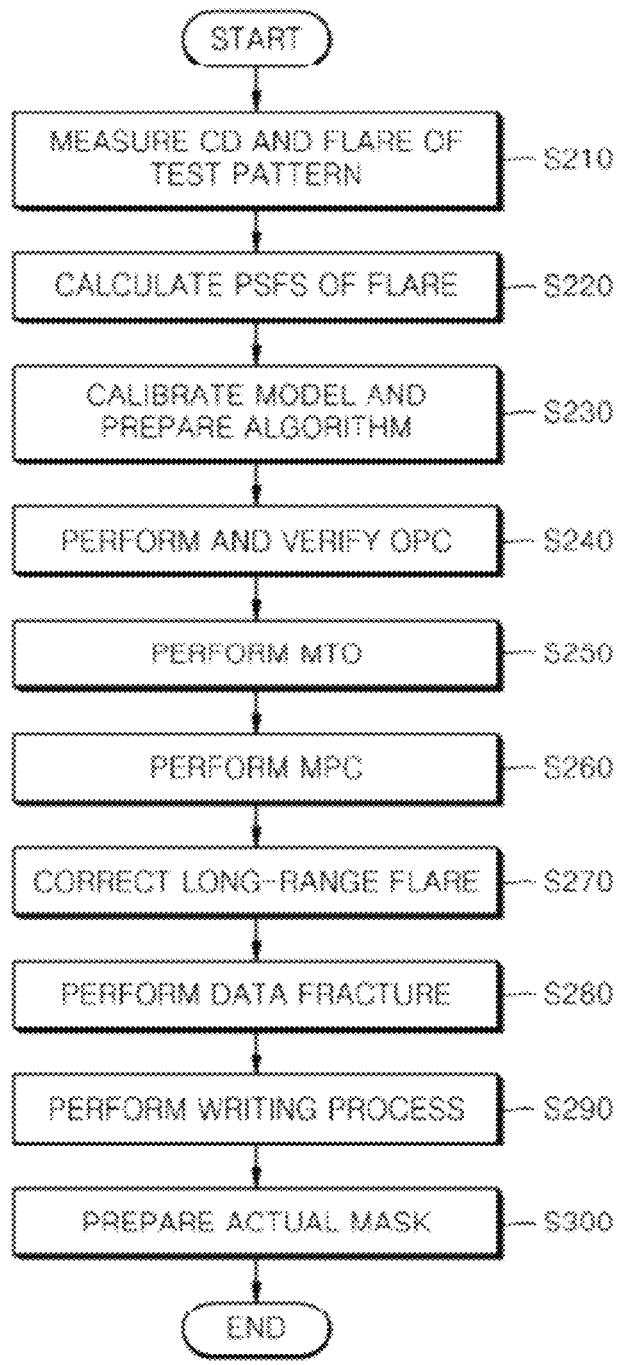
FIG. 7 is a flowchart illustrating a method of preparing an extreme ultraviolet (EUV) mask, according to an embodiment of the inventive concept.

FIG. 7 is a flowchart illustrating a method of preparing an EUV mask. For convenience of description, processes are described sequentially.

Referring to FIG. 7, first, a critical dimension (CD) and flare of a test pattern are measured in operation 5210. Here, the test pattern denotes a pattern that is actually formed on a wafer via EUV lithography using a mask on which a target pattern is formed. Flare may be measured by using Kirk's method as described above, but methods of measuring flare are not limited to Kirk's method.

Next, PSFs of the flare are calculated in operation 5220. The PSFs may be determined by modeling the measured flare as a function of distance. For example, the PSFs may be expressed in a graph of PSF values as a function of radius by being modeled by an inverse power law such as $1/r^{N+1}$ or $K/r^{N+1}$.

Then, a model is calibrated and an algorithm for OPC is prepared in operation S230. The model is calibrated according to a model based OPC, wherein models of various pre-prepared types of pattern-shaped features are used a simulation to calculate a difference between a shape of a mask pattern and a pattern transferred onto a wafer using the mask pattern, and correct the mask pattern based on results of the calculation.

The measured CD and the calculated PSF values may be used in calibrating the model. Specifically, PSF values of short- and middle range flare may be used while calibrating the model. The PSF values are actually convolved with a density map while calibrating the model, which will be described in detail below with reference to FIG. 8. Furthermore, the model calibration may utilize horizontal and vertical (HV) bias values of a layer structure of a reticle that is actually used, i.e., a structure of a multilayer blank layer that includes a reflective layer and an absorption layer, and the shadow effect described above.

An optimal OPC algorithm may be determined after calibrating the model.

Then, OPC is performed and verified in operation 5240. OPC may be performed by using the calibrated model, the algorithm, the HV bias, and the PSF values of the short and middle-range flare. OPC may be verified by simulating pattern contours to determine whether OPC has been suitably performed. Although not shown in FIG. 7, when a pattern contour is outside an error tolerance, the model is re-calibrated or the algorithm is revised, and then OPC is performed and verified again.

After verifying OPC, MTO is performed in operation S250. MTO is performed to request preparation of a mask by transmitting mask modeling data obtained from OPC to a next operation, i.e., operation 5260.

Then, MPC is performed in operation 5260. Although MPC is not usually considered to be part of a conventional ArF lithography process, performing MPC is useful to EUV lithography because it improves resolution and almost completely removes optical proximity effects (OPE) due to the short wavelengths of EUV, and thus MPC may correct proximity effects of the mask itself.

With respect to a mask process, proximity effects such as middle range back scattering or long range fogging, and process induced non-uniformities, may be corrected during a mask writing process. Errors due to short range proximity effects, such as forward scattering, E-beam (EB) optics aberrations, resist blurs from chemically amplified resists (CAR), or etch micro-loading effects, may be corrected during MPC.

Operation 5260 may include, for example, calibrating a mask process model using the CD measured from the test pattern, using the mask process model while changing post-OPC polygons so that an MPC layout can generate a pattern more closely matching the target pattern after the mask process model is applied, performing mask process verification on the OPC and the MPC layout, and correcting non-uniformities.

In addition, the short, middle, and long-range definitions may be identical to or different from those used above to classify flares. For example, short-range for MPC may be from about 30 nm to about 3 μm.

After operation 5260, long-range flare is corrected in operation 5270. As described above, since differences between PSF-based flare maps of long-range flare are not large and have broad values, long range flare may corrected with little calculation. Alternatively, if long-range flare is corrected during operation 5290, operation 5270 may be omitted.

Then, data fracture is performed in operation 5280. Operation 5280 is data format conversion operation, in which data is divided into regions for actual mask preparation, and is also referred to as a mask data fracture process.

After operation S280, a writing process is performed in operation S290. A mask writing process adjusts an exposure dose for each region based on data obtained in previous operations. As described above, the PSF values of long-range flare may be used in the writing process. Also, the middle- and long range proximity effects, excluding the short-range effects, may be corrected in operation S290. If the long-range flare PSF is used in operation S270, the long-range flare PSF may not be used in operation S290. In addition, in terms of matching proximity effect corrections with the long-range flare PSF, the long-range flare PSF may be used in operation S290 rather than operation S270.

After operation S290, an actual mask is prepared via a photolithography process in operation S300.

Figure 8:
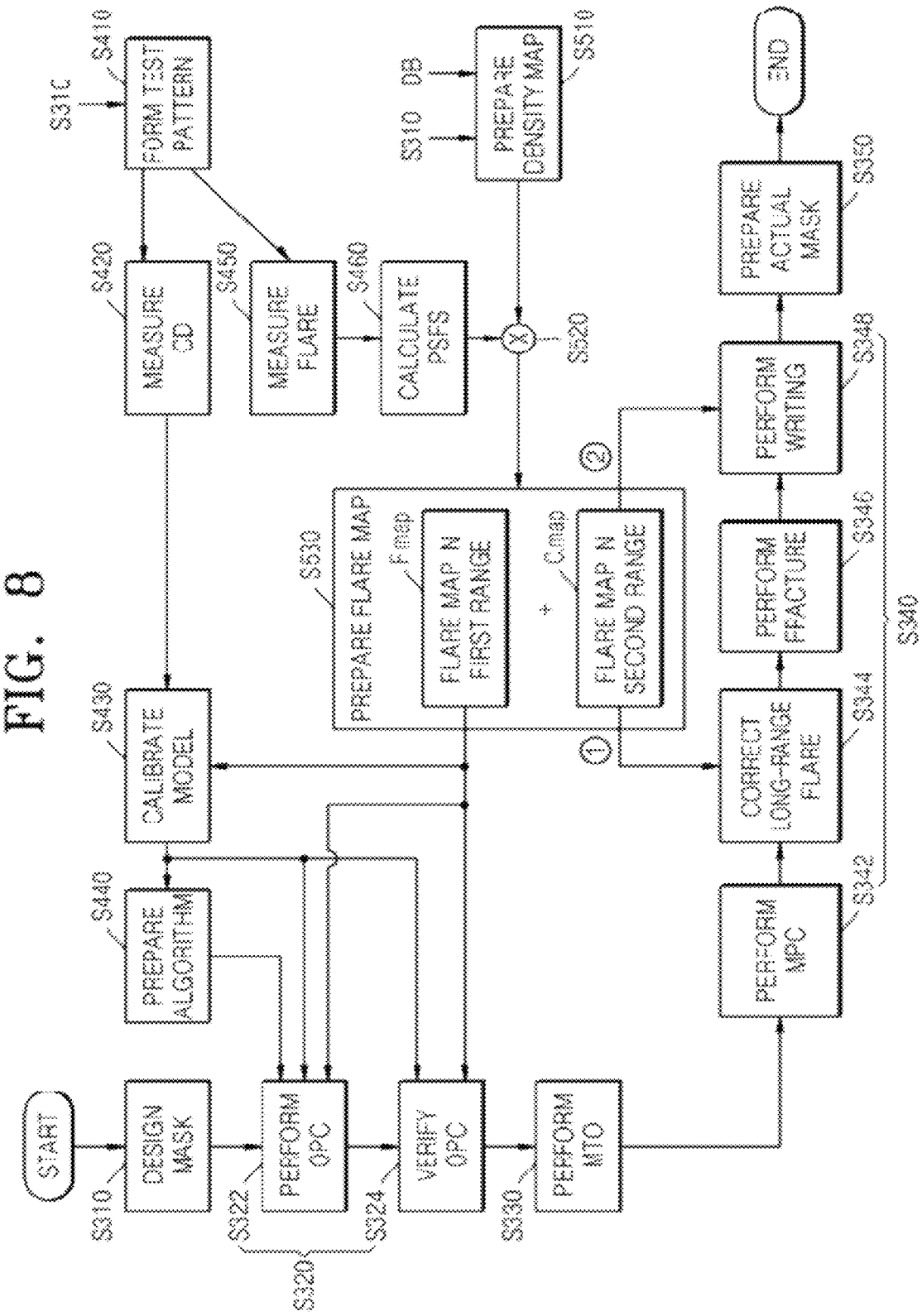
FIG. 8 is a flowchart illustrating the method of FIG. 7 in detail, according to an embodiment of the inventive concept.

FIG. 8 is a flowchart illustrating the method of FIG. 7 in general. For convenience of description, operations described with reference to FIG. 7 will not be repeatedly described.

Referring to FIG. 8, a mask including a target pattern to be formed is designed in operation S310. A test pattern is formed on a wafer via an EUV writing process using the mask in operation S410. A CD of the test pattern is measured in operation S420. Also, flare of the test pattern is measured using Kirk's method or the like, in operation S450.

PSFs are calculated in operation 5460 by modeling the measured flare. In addition, a density map is prepared in operation S510 based on information about a database (DB) pattern related to the target pattern, the test pattern, and a scribe lane.

The PSFs and the density map are convolved in operation 5520 to prepare a flare map in operation 5530. The flare map may be classified into a flare map F.map in a first range corresponding to a short- and middle-range flare map, and a flare map C.map in a second range corresponding to a long-range flare map.

A model is calibrated in operation 5430 based on the measured CD and the first range flare map F.map. Although not shown in FIG. 8, the model calibration may utilize a shadow effect and an HV bias of a reflector layer structure. An optimum algorithm for OPC is prepared in operation 5440 after calibrating the model.

OPC is performed in operation 5322 using the calibrated model, the algorithm, and the flare map F.map. The shadow effect and the HV bias described above may be used during operation S322. OPC is verified in operation 5324. As described above, operation S322 is performed by determining whether a contour calculated in an OPC simulation is within a predetermined error tolerance, and if not, the model calibration, the algorithm preparation, and the OPC performance are repeated until the OPC simulation contour is within the predetermined error tolerance. Here, operations S322 and 5324 may be included in operation 5320. Also, operations 5430 and 5440 may be also included in operation 5320.

After operation 5324, MTO is performed in operation 5330 by transmitting data obtained as described above to request preparation of a mask.

After operation 5330, MPC is performed in operation 5342 by correcting a proximity effect of a mask. As described above, in operation 5342, short-range proximity effects, such as etch-micro loading, are corrected to correct forward scattering effects, EB optical aberrations, CAR resist blurs, and mask linearity errors.

Next, long-range flare is corrected in operation 5344. In other words, flare is corrected based on the second range flare map C.map. Alternatively, long-range flare correction may be performed in operation 5348 as described below, in which case operation S344 may be omitted.

Then, data fracture is performed in operation 346. As described above, data fracture is a data format conversion process that divides data into regions for actual mask preparation.

Next, writing is performed in operation 5348. The writing process adjusts an exposure dose for each region based on data obtained in the previous operations. As described above, the second range flare map C.map may be used in operation S348. For example, the second range flare map C.map may be changed into a dose map to be used in operation 5348. Furthermore, to correct mask linearity errors in operation S348, the middle- and long-range proximity effects may be corrected. Here, operations S342, S344, 5346, and S348 may be referred to as part of operation 5340, performed after MTO.

After operation S340, exposure is performed based on the dose map to prepare an actual mask in operation S350.

While embodiments of the inventive concept has been particularly shown and described with reference to exemplary embodiments thereof, it will be understood that various changes in form and details may be made therein without departing from the spirit and scope of the following claims.

What is claimed is:

1. A method of correcting flare in extreme ultraviolet (EUV) lithography, the method comprising:
   measuring flare of a test pattern;
   calculating point spread functions (PSFs) of the flare as a function of distance; and
   correcting the flare using the corresponding PSF for an influence range of the flare,
   wherein the influence range is divided into a first range less than a predetermined distance and a second range equal to or greater than the predetermined distance, and the predetermined distance corresponds to a distance between full-fields on which an exposure is performed, or a width of a scribe lane of a wafer.

2. The method of claim 1, wherein, when correcting the flare uses a same operation over the first and second influence ranges, corresponding PSFs are separately applied to the first and second ranges to perform optical proximity correction (OPC).

3. The method of claim 1, wherein, when correcting the flare uses different operations for each of the first and second influence ranges, a PSF of the flare in the first range is used for a chip level OPC correction, and a PSF of the flare in the second range is used for long-range flare correction or writing.

4. The method of claim 1, wherein the first range comprises a short-range and a middle-range, which are less than the width of the scribe lane, and the second range comprises a long-range equal to or greater than the width of the scribe lane.

5. The method of claim 1, wherein a shadow effect resulting from an oblique incidence of EUV is used with an OPC.

6. The method of claim 1, wherein the PSFs are convolved with a density map of the test pattern to yield a flare map, and are used for at least one of OPC, long-range flare correction, and writing.

7. The method of claim 6, wherein, when the PSFs are used for writing, the flare map is converted into a dose map.

8. A method of preparing an extreme ultraviolet (EUV) mask, the method comprising:
   measuring a critical dimension (CD) and flare of a test pattern on a wafer formed using a test mask;
   calculating point spread functions (PSFs) of the flare;
   preparing an algorithm for optical proximity correction (OPC) based on the CD and the PSFs;
   performing mask process correction (MPC) by correcting a mask process proximity effect based on OPC result data;
   dividing MPC result data into regions for the mask preparation; and
   adjusting a mask preparation exposure dose based on the divided result data for each region,
   wherein PSFs corresponding to an influence range are used to correct the flare,
   wherein the influence range is divided into a first range less than a predetermined distance and a second range equal to or greater than the predetermined distance, and the predetermined distance corresponds to a distance between full-fields on which an exposure is performed, or a width of a scribe lane of a wafer.

9. The method of claim 8, further comprising
   calibrating a model based on the CD and the PSFs;
   performing and verifying OPC on a mask using the calibrated model and the OPC algorithm; and
   performing mask tape-out (MTO) by transmitting OPC result data for mask preparation.

10. The method of claim 9, wherein, when correcting the flare uses a same operation over the first and second influence ranges, corresponding PSFs are separately applied to the first and second ranges for calibrating the model, performing OPC, and verifying the OPC.

11. The method of claim 9, wherein, when correcting the flare uses different operations for each of the first and second influence ranges, PSFs of the flare in the first range are used for a chip level correction comprising calibrating the model, performing OPC, and verifying OPC, and a PSF of the flare in the second range are used for any one of correcting long-range flare and adjusting the dose after performing MPC.

12. The method of claim 9, wherein a shadow effect resulting from an oblique incidence of EUV is used for calibrating the model, performing OPC, and verifying OPC.

13. A method of correcting flare in extreme ultraviolet (EUV) lithography, the method comprising:
- providing point spread functions (PSFs) of flare of a test pattern as a function of distance; and
- correcting the flare using the corresponding PSF for an influence range of the flare,
- wherein the influence range is divided into a first range less than a predetermined distance and a second range equal to or greater than the predetermined distance, the predetermined distance corresponds to a distance between full-fields on which an exposure is performed, or a width of a scribe lane of a wafer, and corresponding PSFs are separately applied to the first and second ranges to correct the flare.

14. The method of claim 13, wherein correcting the flare comprises performing optical proximity correction (OPC) over the first and second influence ranges.

15. The method of claim 13, wherein correcting the flare comprises performing a chip level OPC correction in the first range, and long-range flare correction or writing in the second range.

16. The method of claim 15, further comprising convolving the PSFs with a density map of the test pattern to yield a flare map, and converting the flare map into a dose map when the PSFs are used for writing.

* * * * *